United States Patent [19]

Morita

[11] Patent Number: 4,843,025
[45] Date of Patent: Jun. 27, 1989

[54] METHOD OF FABRICATING TRENCH CELL CAPACITORS ON A SEMOCONDCUTOR SUBSTRATE

[75] Inventor: Yoshikimi Morita, Takatsuki, Japan

[73] Assignee: Matsushita Electronics Corporation, Osaka, Japan

[21] Appl. No.: 194,262

[22] Filed: May 10, 1988

[30] Foreign Application Priority Data

May 25, 1987 [JP] Japan .................................. 62-127560

[51] Int. Cl.[4] ..................... H01L 21/72; H01L 21/385
[52] U.S. Cl. ......................................... 437/47; 437/60; 437/203; 437/89; 437/919; 357/23.6
[58] Field of Search ..................... 437/47, 60, 203, 89, 437/228, 919; 357/23.6; 148/DIG. 50; 156/643

[56] References Cited

U.S. PATENT DOCUMENTS

| | | | |
|---|---|---|---|
| 4,353,086 | 10/1982 | Jaccodine et al. | 357/51 |
| 4,713,678 | 12/1987 | Womack et al. | 357/23.6 |
| 4,728,623 | 3/1988 | Lu et al. | 437/60 |
| 4,734,384 | 3/1988 | Tsuchiya | 437/52 |
| 4,751,558 | 6/1988 | Kenney | 357/23.6 |

FOREIGN PATENT DOCUMENTS

| | | | |
|---|---|---|---|
| 3525418 | 1/1986 | Fed. Rep. of Germany . | |
| 0053415 | 4/1980 | Japan | 437/89 |
| 0087339 | 7/1981 | Japan | 437/89 |
| 0197839 | 11/1983 | Japan | 437/85 |
| 0193358 | 10/1985 | Japan | 437/89 |
| 227463 | 11/1985 | Japan . | |

OTHER PUBLICATIONS

Shah et al., "A 4-Mbit DRAM with Trench-Transistor Cell." IEEE J. of Solid-State Circuits, vol. SC-2v, No. 5, Oct. 1986, pp. 618-626.

Primary Examiner—Brian E. Hearn
Assistant Examiner—Tom Thomas
Attorney, Agent, or Firm—Wenderoth, Lind & Ponack

[57] ABSTRACT

This invention relates to a method of fabricating trench cell capacitors which comprises a step of forming a first trench having side walls and a bottom, the side walls are substantially vertical to a surface of a semiconductor substrate of one conductive type and forming an oxide layer on the side walls and bottom of said first trench, a step of forming a silicon nitride layer on the oxide layer of the side walls of said first trench, and removing the oxide layer on the bottom of said first trench by anisotropic etching using said silicon nitride layer as a mask, a step of removing said silicon nitride layer and growing an epitaxial layer of the same conductive type as said semiconductor substrate in said first trench to embed the first trench with this epitaxial layer, and a step of removing the oxide layer remaining on the side wall of said first trench to form a loop-shaped second trench. According to this fabricating method, a fine trench having a high aspect ratio can be accurately formed, and the degree of integration of semiconductor memory device can be enhanced. Unlike the conventional method of employing the anisotropic dry etching method, damage of the side wall of trench or sharp residual damage of the periphery of the bottom of trench does not occur.

8 Claims, 2 Drawing Sheets

METHOD OF FABRICATING TRENCH CELL CAPACITORS ON A SEMOCONDCUTOR SUBSTRATE

BACKGROUND OF THE INVENTION

This invention relates to a method of fabricating a semiconductor memory device, or more particularly to a method of fabricating a trench cell capacitors of a MOS memory device.

Recently, along with the trend of higher degree of integration of MOS memory device, the shrinkage technology has been further advanced, and in order to shrink the memory cell in mega-bits DRAM, a method of opening a recess called trench in the semiconductor substrate and fabricating a capacitor by making use of the inner wall of the recess is being employed.

FIG. 2 shows a conventional manufacturing method of trench cell capacitor of such MOS memory device.

First, as shown in FIG. 2 (a), a p-type epitaxial layer 2 is formed on a surface of a p type semiconductor substrate 1. On the surface of the epitaxial layer 2, a field oxide layer 3 is selectively formed by a wellknown method, and a CVD $SiO_2$ layer 4 is deposited on the whole surface of the epitaxial layer 2 and on the field oxide layer 3. Next, applying a resist on the surface of the CVD $SiO_2$ layer 4, the resist is patterned, and the CVD $SiO_2$ layer 4 is removed by etching to obtain a desired shape (in this example, a square loop shape). Afterwards, using the CVD $SiO_2$ layer 4 as a mask, a loopshaped trench 5 is formed in the epitaxial layer 2 by anisotropic dry etching, using a etching gas including fluorine (F) or chlorine (Cl) gas. And, the CVD $SiO_2$ layer 4 used as the mask is removed by etching technique.

Next, as shown in FIG. 2 (b), a shallow $N^+$ layer 6 is formed by diffusion on the side walls and bottom wall of the loop-shaped trench 5. Furthermore, a dielectric layer 7 is formed on the side walls and bottom wall of the trench 5 and on the surface of the epitaxial layer 2 excluding the field oxide layer 3. Finally, a polycrystalline silicon layer 8 containing phosphorus is formed on the surface of the dielectric layer 7 and on the field oxide layer 3. This polycrystalline silicon layer 8 is formed to fill the inside of the trench 5 entirely.

In this way, a trench cell capacitor using the $N^{30}$ layer 6 as a first electrode and polycrystalline silicon layer 8 as a second electrode is formed on the side wall and bottom of the trench 5.

In such conventional fabricating method, however, it is hard to form the trench 5 accurately, especially when the aspect ratio (trench depth/trench width) of the trench 5 is high. For example, in the case of a DRAM with 4M bits or more, the trench 5 is often designed as the trench width of 0.9 to 1.0 micron and depth of about $4\pm1$ microns (in this example, the aspect ratio is 5 or more). When such trench 5 is formed by the anisotropic dry etching, the middle part of the side wall of the trench 5 expands toward the outside of the trench 5 in the process of the etching. This is a so-called "bowing" phenomenon caused by side etching. When the trench 5 is deformed in such a way, it is hard to obtain an expected capacitance.

Besides, when it is continued to dig a trench to a depth of about 4 to 5 microns by anisotropic dry etching, the side walls of the trench 5 are damaged in the process of etching, and a sharp residual damage is formed from the periphery of the bottom of the trench 5 toward into the semiconductor substrate 1. When the side wall is damaged, pinholes are liable to be formed in the dielectric layer 7, and the breakdown voltage of the dielectric layer 7 is reduced. Or when a sharp residual damage is formed at the periphery of the bottom, an electric field is concentrated at this portion, and it becomes difficult to restrict the leakage current between adjacent capacitors.

SUMMARY OF THE INVENTION

It is hence a primary object of this invention to present a method of fabricating a trench cell capacitor with high aspect ratio precisely.

It is a second object of this invention to present a method of fabricating a trench cell capacitor on a semiconductor substrate without causing damage to the side walls or residual damage in the periphery of the bottom of the trench, and subsequently increasing a breakdown voltage of the dielectric layer and restricting the leakage current between adjacent trench capacitors.

In order to achieve the above objects, this invention presents a method of fabricating trench cell capacitors on a semiconductor substrate which is comprised of following steps: a step of forming a first trench having side walls and a bottom, said side walls are substantially vertical to a surface of the semiconductor substrate of one conductive type and forming an oxide layer on the side walls and the bottom of said first trench, a step of selectively forming a silicon nitride layer on the oxide layer of the side walls of the first trench, and removing the oxide layer on the bottom of the first trench by using the silicon nitride layer as a mask by anisotropic dry etching, a step of removing the silicon nitride layer a step of forming an epitaxial layer of the same conductive type as said semiconductor substrate in the first trench so as to emded the first trench with the epitaxial layer, and a step of removing the oxide film remaining on the side walls of the first trench and forming a second trench having predetermined shaped.

Other features and objects of the present invention will be apparent from the following description taken in connection with the accompanying drawings.

DETAILED DESCRIPTION OF THE INVENTION

Figure 1A:
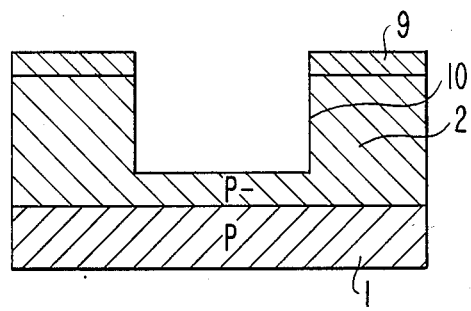
FIG. 1 (a) to (e) are cross sectional views showing the process seqeunce of the fabricating method of semiconductor memory in one embodiment of this invention, and FIG. 2 (a), (b) are cross sectional views showing the process sequence of the conventional fabricating method of semiconductor memory.

One embodiment of this invention is explained according to the process sequence cross sectional views in FIG. 1 (a) to (e).

First, as shown in FIG. 1 (a), a first epitaxial layer of p type 2 is formed on a p type semiconductor substrate 1. A CVD $SiO_2$ layer 9 is deposited on the whole surface of the first epitaxial layer 2. A photoresist is coated on the surface of the CVD $SiO_2$ layer 9, and after patterning the resist, the CVD $SiO_2$ layer 9 is removed in a desired shape by etching (in this example, a square or rectangular shape with one side measuring about 3 to 5 microns). Afterwards, using the CVD $SiO_2$ layer 9 as a mask, a first trench 10 of a rectangular parallelepiped shape is formed in the first epitaxial layer 2 by anisotropic dry etching using a etching gas including fluorine (F) or chlorine (Cl) gas. Supposing the depth of the first trench 10 to be about 4±1 microns, the trench width is about 3 to 5 microns, and therefore the aspect ratio of the first trench 10 is nearly 1. Hence, as for the first trench 10, if formed by anisotropic dry etching, the "bowing" phenomenon will not occur, and the trench will be formed exactly as designed. Incidentally, when the aspect ratio is 5 or less, the first trench will be formed exactly.

Next, in $O_2$ ambient condition, by thermal oxidation at temperature of about 900° to 1000° C., as shown in FIG. 1 (b), an oxide layer 11 of about 5000 to 800 Å thick is formed on the side walls and bottom of the first trench 10. The oxide layer 11 is to be finally removed, and will form a second trench for a trench cell capacitor. Therefore, it is desired to control the thickness of the oxide layer 11 as precisely as possible. When forming the oxide layer 11 by thermal oxidation, the thickness can be controlled accurately in the sub-micron order by regulating the oxidation temperature and oxidation time. Therefore, the trench width of the second trench finally obtained can be accurately determined. Aside from the thermal oxidation method, the oxide layer 11 may be formed by the other method, for example, such as CVD method. In such a case, if the conditions are sufficiently controlled, it is, also, possible to control the thickness of the oxide layer 11 accurately. Meanwhile, as shown in FIG. 1 (b), the inner surface of the oxide layer 11 slightly extends inward from the inner wall of the first trench 10 (which is shown in FIG. 1(a)).

Figure 1B:
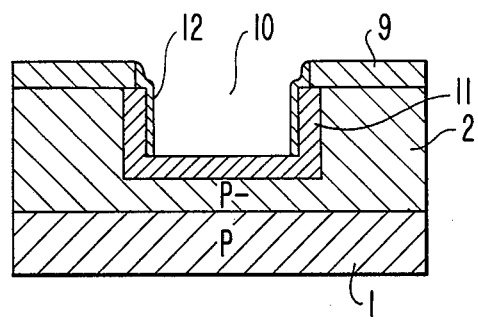
Figure 1C:
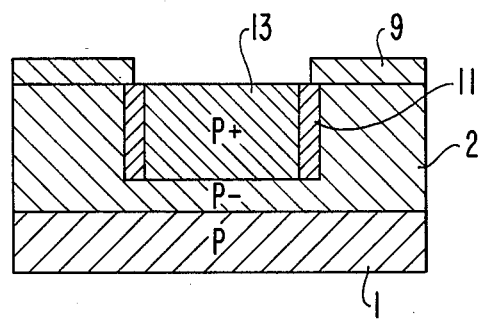
Figure 1D:
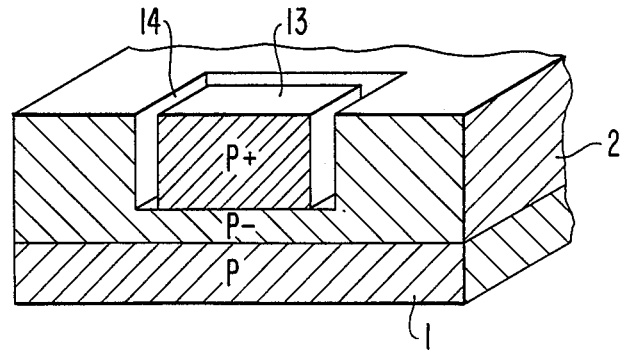
Figure 1E:
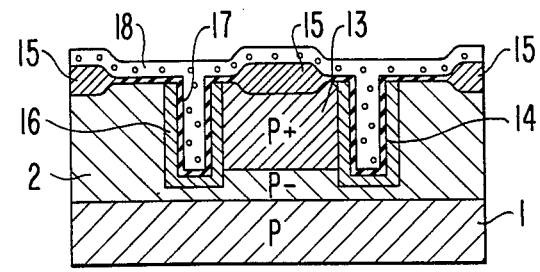
Figure 2A:
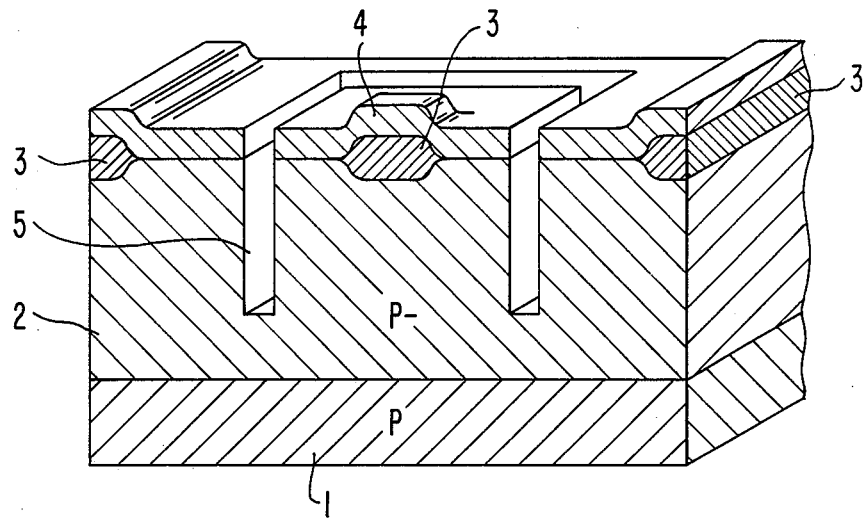
Figure 2B:
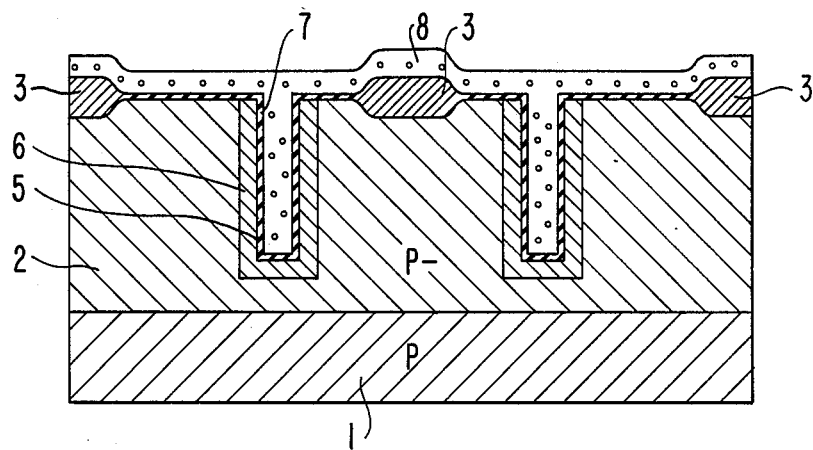

In the next step, a silicon nitride layer 12 is deposited on the entire surface of the oxide layer 11 and the CVD $SiO_2$ layer 9 by a low pressure CVD method, in a thickness of 500 to 1000 Å. Then this silicon nitride layer 12 is selectively removed by anisotropic dry etching, and is left only on the side walls of the CVD $SiO_2$ layer 9 and oxide layer 11 as shown in FIG. 1(b). Incidentally if the silicon nitride layer 12 is too thick, when the oxide layer 11 in the bottom of the first trench 10 is removed by anisotropic dry etching as mentioned later, a difference in the surface level of the oxide layer 11 on the side wall of the first trench is caused, and the difference is left inside wall of the second trench which is obtained finally. To avoid this, it is desired to set the thickness of the silicon nitride layer 12 at less than 1/10 of the thickness of the oxide layer 11.

Subsequently, as shown in FIG. 1 (c), using the silicon nitride layer 12 as a mask, the oxide layer 11 on the bottom of the first trench 10 is removed by anisotropic dry etching, and the oxide layer 11 is left only on the side walls of the first trench 10. Next, the silicon nitride layer 12 is removed by hot phosphoric acid (160° C.). In consequence, by low pressure epitaxial growth method, a second epitaxial layer (p+ layer) 13 is grown on the entire surface of the bottom of the first trench 10 and the oxide layer 11 at boron concentration of $1 \times 10^{16}$ to $1 \times 10^{17}$ cm$^{-3}$, at a temperature of about 1000° to 1100° C., using hydrogen as carrier gas, and dichlorosilane ($SiH_2zCl_2$) and diborane ($B_2H_6$) as source materials, and the first trench 10 is embedded completely. Or the second epitaxial layer 13 may be also formed by photo-CVD method using excimer laser or plasma CVD method.

Then, by the etching using a solution including hydrogen fluoride, the both of CVD $SiO_2$ layer 9 and oxide layer 11 are removed, and as a result, a loop-shaped second trench 14 is formed between the first epitaxial layer 2 and the second epitaxial layer 13 as shown in FIG. 1 (d).

As mentioned above, the second trench 14 is formed by removing the oxide layer 11 shown in FIG. 1 (d). Therefore, the aspect ratio of the second trench 14 is high, with the depth of about 4±1 microns, and the trench width of 0.5 to 0.8 microns. Since the oxide layer 11 is controlled in the same thickness from the top to the bottom by the thermal oxidation method or CVD method, the trench width of the loop-shaped second trench 14 formed by removing the oxide layer 11 is also the same width from the opening to the bottom. Therefore, according to this embodiment, the shape of the second trench 14 for the trench cell capacitor can be controlled very accurately, and a fine trench with a desirable shape and a high aspect ratio can be obtained. In the conventional method of anisotropic dry etching, as mentioned above, the control of shape is very difficult when the aspect ratio is 5 or more, whereas in the method of this embodiment it is particularly effective when forming a trench with aspect ratio of 5 or more.

In succession, as shown in FIG. 1 (e), field oxide films 15 are selectively formed on the surface of the first and second epitaxial layers 2 and 13, and consequently the confronting sides of the loop-shaped second trench 14 and the adjacent second trenches are separated by said field oxide film 15. By diffusing and forming a shallow N+ layer 16 on the side walls and bottom of the second trench 14, a dielectric layer 17 is formed on the surface of the N+ layer 16 and the surface of the first and second epitaxial layers 2 and 13 except for the surface of the field oxide layer 15. Finally, on the surface of the dielectric layer 17 and field oxide layer 15, a polycrystalline silicone layer 18 containing phosphorus is formed. This polycrystalline silicon layer 18 is formed so as to embed the inside of the second trench 14 completely.

In this way, a trench capacitor is formed on the side walls and bottom of the second trench 14, using the N+ layer 16 as a first electrode and the polycrystalline silicon layer 18 as a second electrode.

According to this invention, a fine trench having a high aspect ratio can be formed accurately, so that the degree of integration of semiconductor memory device can be greatly enhanced. Still more, different from the conventional method of anisotropically dry etching, damage of the side wall of the trench or sharp residual damage of the periphery of the bottom of the trench does not occur, and hence it becomes possible to increase the breakdown voltage of the dielectric layer and restrict the leakage current between adjacent trenches so that the characteristics of the trench cell capacitor can be dramatically enhanced.

What is claimed is:

1. A method of fabricating trench cell capacitors on a semiconductor substrate comprising steps of:
   a step of forming a first trench having side walls and a bottom, said side walls are substantially vertical to a surface of said semiconductor substrate of one conductive type;
   a step of forming an oxide layer on said side walls and said bottom of said first trench;
   a step of selectively forming a silicon nitride layer on said oxide layer of said side walls of said first trench;

a step of removing said oxide layer on said bottom of said first trench by an anisotropic etching using said silicon nitride layer as a mask;

a step of removing said silicon nitride layer;

a step of growing an epitaxial layer of the same conductive type as said semiconductor substrate in said first trench so as to embed said first trench with said epitaxial layer; and a step of removing said oxide layer remaining on said side walls of said first trench, thereby a second trench having predetermined shape between said semiconductor substrate and said epitaxial layer is formed.

2. A method of fabricating trench cell capacitors according to claim 1, wherein said semiconductor substrate is comprised of a base semiconductor substrate and an epitaxial layer of the same conductivity type as said base semiconductor substrate grown on said base semiconductor substrate.

3. A method of fabricating trench cell capacitors according to claim 1, wherein said predetermined shape is loop-shape.

4. A method of fabricating trench cell capacitors according to claim 1, wherein an aspect ratio of the first trench is 5 or less and that of the second trench is 5 or more.

5. A method of fabricating trench cell capacitors according to claim 1, wherein the epitaxial layer embeded in the first trench is formed by any one of the low pressure epitaxial growth method, photo-CVD method and plasma CVD method.

6. A method of fabricating trench cell capacitors according to claim 1, thickness of said silicon nitride layer is set at 1/10 or less of a thickness of said oxide layer.

7. A method of fabricating trench cell capacitors according to claim 3, wherein field oxide layers are selectively formed on or near the center of said loop-shaped second trench and on said surface of said semiconductor substrate between adjacent second trenches.

8. A method of fabricating trench cell capacitors on a semiconductor substrate comprising steps of:

a step of forming a first epitaxial layer of one conductivity type on a semiconductor substrate of the same conductivity type as said first epitaxial layer;

a step of forming a first trench having side walls and a bottom, said side walls are substantially vertical to a surface of said first epitaxial layer;

a step of forming an oxide layer on said side walls and said bottom of said first trench;

a step of selectively forming a siclicon nitride layer on said oxide layer of said side walls of said first trench;

a step of removing said oxide layer on said bottom of said first trench by an anisotropic etching using said silicon nitride layer as a mask;

a step of removing said silicon nitride layer;

a step of growing a second epitaxial layer of the same conductivity type as said semiconductor substrate in said first trench so as to embed said first trench with said second epitaxial layer;

a step of removing said oxide layer remaining between sais first and second epitaxial layers, thereby a loop-shaped second trench between said first and second epitaxial layers is formed;

a step of forming a dielectric layer on a whole inner surface of said second trench; and a step of forming a electrode on said dielectric layer.

* * * * *